(12) United States Patent
Morgan

(10) Patent No.: US 8,622,572 B2
(45) Date of Patent: Jan. 7, 2014

(54) LED ILLUMINATION SYSTEM FOR REPLACING FLUORESCENT LAMPS

(76) Inventor: Brian K. Morgan, Lee's Summit, MO (US)

( * ) Notice: Subject to any disclaimer, the term of this patent is extended or adjusted under 35 U.S.C. 154(b) by 0 days.

(21) Appl. No.: 13/450,067

(22) Filed: Apr. 18, 2012

(65) Prior Publication Data

US 2012/0206909 A1   Aug. 16, 2012

Related U.S. Application Data

(63) Continuation of application No. 13/372,297, filed on Feb. 13, 2012, now abandoned.

(60) Provisional application No. 61/442,035, filed on Feb. 11, 2011.

(51) Int. Cl.
F21S 4/00 (2006.01)

(52) U.S. Cl.
USPC ........... 362/225; 362/659; 362/219; 362/221; 362/217.17; 362/249.06

(58) Field of Classification Search
USPC ................. 362/657, 658, 659, 219, 221, 225, 362/217.17, 249.02, 249.06, 249.07, 249.1, 362/800
See application file for complete search history.

(56) References Cited

U.S. PATENT DOCUMENTS

| | | |
|---|---|---|
| 5,952,789 A | 9/1999 | Stewart et al. |
| 6,283,612 B1 | 9/2001 | Hunter |
| 6,608,453 B2 | 8/2003 | Morgan et al. |
| 6,739,734 B1 * | 5/2004 | Hulgan ............... 362/243 |
| 6,762,562 B2 | 7/2004 | Leong |
| 6,860,628 B2 | 3/2005 | Robertson et al. |
| 6,997,576 B1 * | 2/2006 | Lodhie et al. ............ 362/240 |
| 7,053,557 B2 | 5/2006 | Cross et al. |
| 7,114,830 B2 | 10/2006 | Robertson et al. |
| 7,377,669 B2 * | 5/2008 | Farmer et al. ........ 362/249.01 |
| 7,441,922 B2 * | 10/2008 | Huang et al. ............ 362/235 |
| 7,488,086 B2 * | 2/2009 | Wu et al. ............. 362/225 |
| 7,513,639 B2 * | 4/2009 | Wang ................ 362/218 |
| 7,594,738 B1 * | 9/2009 | Lin et al. ........... 362/249.02 |
| 7,665,862 B2 | 2/2010 | Villard |
| 7,712,918 B2 | 5/2010 | Siemiet et al. |
| 7,722,221 B2 * | 5/2010 | Chae ................ 362/294 |
| 7,824,056 B2 * | 11/2010 | Madireddi et al. ......... 362/125 |
| 7,871,180 B2 * | 1/2011 | Wu et al. ............. 362/219 |
| 7,918,580 B2 * | 4/2011 | Liu ................. 362/218 |
| 7,922,354 B2 * | 4/2011 | Everhart ............. 362/235 |
| 7,954,979 B2 * | 6/2011 | Sommers et al. ........ 362/217.01 |
| 7,976,196 B2 * | 7/2011 | Ivey et al. ............ 362/294 |
| 8,092,043 B2 * | 1/2012 | Lin et al. ........... 362/249.02 |
| 2006/0022214 A1 | 2/2006 | Morgan et al. |

(Continued)

FOREIGN PATENT DOCUMENTS

WO    WO 2009131340 A2 * 10/2009    ............ F21K 99/00

*Primary Examiner* — Ismael Negron
(74) *Attorney, Agent, or Firm* — Lathrop & Gage LLP

(57) ABSTRACT

A lighting assembly including an elongated mounting component with two elongated and angled mounting surfaces, two or more LED-based printed circuit board having a plurality of LEDs on one surface and circuitry on a second surface. The printed circuit boards are fastened to the mounting surfaces, by a plurality of longitudinally-spaced nonconductive fasteners, substantially parallel but elevated above the mounting surfaces. The lighting assembly is configured to be mountable to extend within existing light fixtures such that the LEDs are positioned to provide a light pattern similar to the illumination pattern previously produced by the original fixture.

11 Claims, 9 Drawing Sheets

(56) References Cited

U.S. PATENT DOCUMENTS

| | | |
|---|---|---|
| 2006/0285325 A1 | 12/2006 | Ducharme et al. |
| 2007/0223225 A1* | 9/2007 | Eiich et al. .................... 362/260 |
| 2008/0062689 A1 | 3/2008 | Villard |
| 2008/0266849 A1 | 10/2008 | Nielson et al. |
| 2010/0102729 A1* | 4/2010 | Katzir et al. ................. 315/113 |
| 2010/0106306 A1 | 4/2010 | Simon et al. |
| 2010/0270925 A1* | 10/2010 | Withers ........................ 315/51 |
| 2011/0019398 A1* | 1/2011 | Bishop et al. ................. 362/225 |
| 2011/0117786 A1* | 5/2011 | Takata .......................... 439/628 |
| 2011/0149563 A1* | 6/2011 | Hsia et al. .................... 362/221 |
| 2011/0176297 A1* | 7/2011 | Hsia et al. ................. 362/217.1 |
| 2011/0292647 A1* | 12/2011 | Chang .......................... 362/218 |
| 2012/0033420 A1* | 2/2012 | Kim et al. .................... 362/235 |
| 2012/0170258 A1* | 7/2012 | VanDuinen et al. ...... 362/217.02 |

* cited by examiner

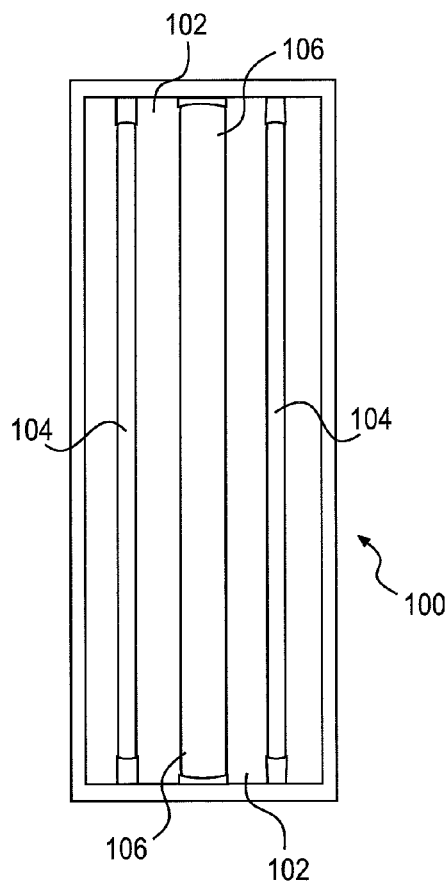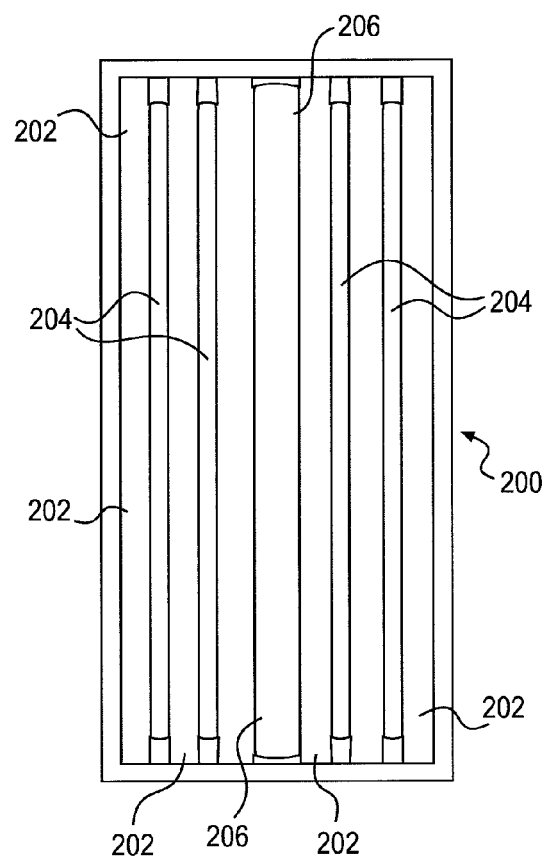
FIG. 1
PRIOR ART
FIG. 2
PRIOR ART

LED ILLUMINATION SYSTEM FOR REPLACING FLUORESCENT LAMPS

CROSS-REFERENCE TO RELATED APPLICATIONS

This application is a continuation of U.S. patent application Ser. No. 13/372,297, filed Feb. 13, 2012 now abandoned, which claims priority to U.S. Provisional Patent Application No. 61/442,035, filed on Feb. 11, 2011, the disclosures of which are hereby incorporated by reference in their entirety.

BACKGROUND OF THE INVENTION

1. Field of the Invention

The invention relates generally to the field of illumination. More specifically, the invention relates to the field of providing lighting using light emitting diodes to replace more conventional lighting systems.

2. Description of the Related Art

There are many devices used to retrofit conventional lighting fixtures, such as fluorescent lighting fixtures. For example, FIG. 1 depicts a conventional fluorescent lamp assembly 100 that exists in numerous buildings. The lamp assembly 100 includes a housing 102 and two parallel fluorescent lamp bulbs 104. Also included in the housing 102 is a rectangular protruding ballast cover 106. The cover 106 (which is removable) includes not only the ballast, but also the associated electronics equipment.

FIG. 2 shows another conventional fluorescent lamp arrangement 200 commonly found in buildings and other structures. The lamp arrangement 200 includes a housing 202 that contains four fluorescent bulbs 204. There is also a centrally located rectangular metal cover 206, which houses the ballast equipment and associated electronics.

These lamp assemblies may be updated in a variety of fashions, but are generally retrofit using non-fluorescent bulbs, such as bulbs having a similar size and shape of a fluorescent bulb. For example, a conventional lamp assembly may be retrofit by replacing a fluorescent tube with an LED-based tube of similar shape and size. However, although such a retrofit removes the drawbacks associated with the fluorescent tube, it does little to provide additional advantages or benefits.

These and other problems exist with respect to conventional lighting fixture retrofitting systems and procedures.

SUMMARY

A system and method for retrofitting conventional lighting fixtures, such as retrofitting lighting fixtures using LED illumination systems that maximize the benefits of LEDs, is described. In some embodiments, the system includes a mount, or mounting component, and a printed circuit board that includes multiple light emitting diodes (LEDs).

In some embodiments, the mount includes two or more angled faces in which printed circuit boards having multiple LEDs are attached, in order to provide a desired spread of illumination below a lighting fixture, among other benefits.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein:

FIG. 1 is a view of a conventional fluorescent lighting fixture which can be subjected to the systems and methods of the disclosed embodiments;

FIG. 2 is a view of another conventional lighting fixture which may be subjected to the systems and methods of the disclosed embodiments;

DETAILED DESCRIPTION

As described herein, in some embodiments, a system and method for incorporating LEDs into existing lighting environments is described.

Figure 3A:
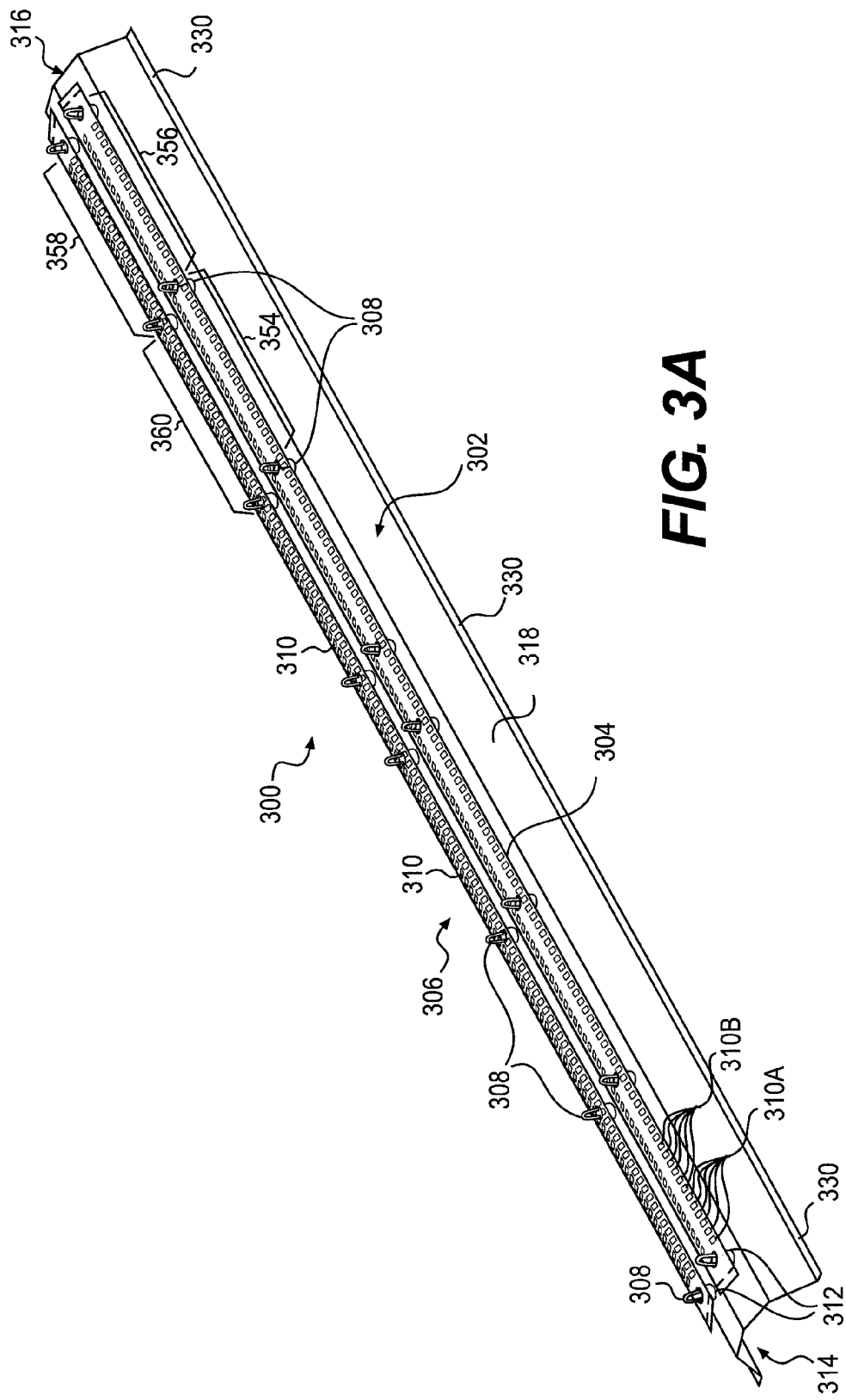
FIG. 3A is a perspective view of an embodiment of a retrofit LED assembly which may be used to convert a fluorescent fixture into an LED lamp.
Figure 3B:
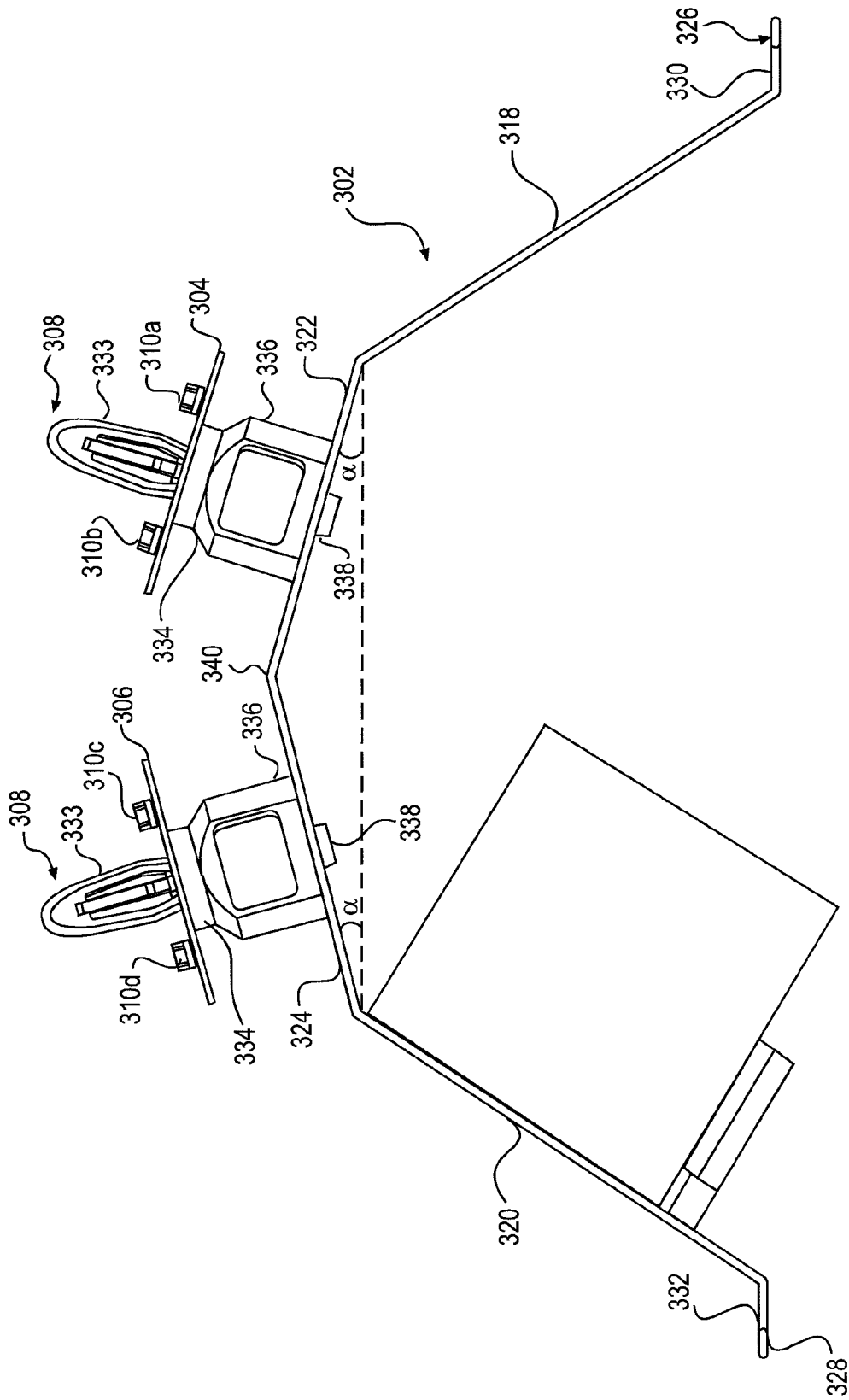
FIG. 3B is an end view of the assembly shown in FIG. 3A.
Figure 3C:
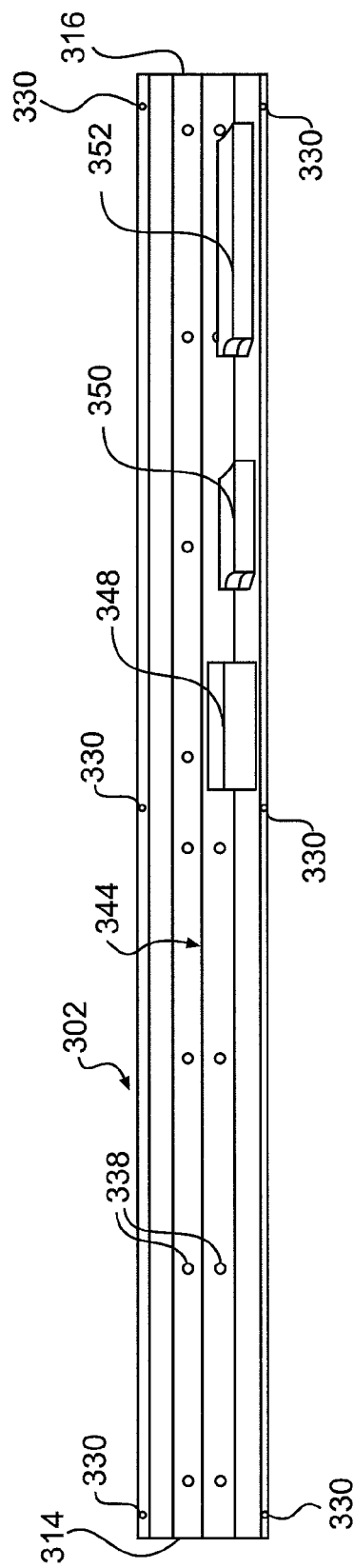
FIG. 3C is an underside view of the assembly shown in FIG. 3A.

FIGS. 3A-C show a lighting assembly 300 that is configured to be mounted into numerous existing fluorescent fixtures for retrofitting purposes. Looking first at FIG. 3A, we see a mounting component or mount 302, which may be constructed of sheet metal. Mount 302 is used to support a first elongated printed circuit board (PCB) 304 of LEDs and a second elongated PCB 306 of LEDs. As described in more detail herein, the boards 304 and 306 may be constructed of multiple smaller LED boards that are connected together using PCB connector blocks. Thus, each of the two elongated boards 304 and 306 are, in some embodiments, formed of smaller boards.

The two elongated boards 304 and 306 are mounted atop the mount 302 using non-conductive PCB spacer fasteners 308. The spacer fasteners 308 support each of the elongated PCB boards 304 and 306 at a slight distance above upper angled surfaces of the mount 302. The fasteners 308 may be constructed using flame-retardant nylon. The structural details regarding these fasteners 308 are discussed herein.

Multiple LEDs 310 are included on each of the boards 304 and 306. For example, in some embodiments, the selected LEDs are six ohm, 3.5 volt, 20 milliamp, 92% efficient, LEDs, with suitable LED dies. These dies may be commercially available.

FIG. 3A also depicts certain configurations, or groupings, of multiple LEDs 310 on boards 304 and 306. For example, in some embodiments, the boards 304, 306 may include a first group of LEDs 310a as well as a second group of LEDs 310b. In some cases, the LEDs are broken into groups of six LEDs for a variety of reasons, such as for separate operational purposes. One skilled in the art will recognize, however, that various different sizes of groups could be used to accomplish different purposes. It should also be understood that although only two groups (310a and 310b) have been identified in FIG. 3A, the rest of the remaining LEDs could also be broken out in to a variety of groupings to accomplish dimming, directional lighting, contrasted lighting arrangements or patterns and/or other desired light-controlling objectives.

Referring again to FIG. 3A, the first board 304 and second board 306 extend from a first end 314 to a second end 316 of the mount 302. At the first end 314, the mount 302 includes a pair of power supply terminals 312 shown at both ends of each of boards 304 and 306. These terminals 312 may be electrically connected to a variety of power sources, such as AC primary power, emergency AC backup power, and/or DC battery backup power, using wires or other conductor pair arrangements. The LEDs 300, including LEDs groups 310a and 310b, may be controlled using circuitry existing on the back of the boards 304 and 306. Further details regarding various circuitry arrangements are described herein.

As described herein, in some embodiments, the mount 302 is configured to include two or more angled faces onto which the board 304 and 306 are attached. FIG. 3B depicts a cross-sectional view of the mount 302. The mount 302 includes an angled face 318 on a first side, and another angled face 320 on the opposite side. Above face 318, a leveled off face 322 exists at an angle α relative to horizontal. In some embodiments, angle α falls within the range of 15 degrees, plus or minus 10 degrees. In some embodiments, angle α falls within the range of 15 degrees, plus or minus 5 degrees. In some embodiments, angle α falls within the range of 15 degrees, plus or minus 3 degrees. In some embodiments, angle α falls within the range of 15 degrees, plus or minus 1.5 degrees. In some embodiments, such as those depicted in FIG. 3B, angle α is about or approximately 15 degrees. Having such ranges, the mount 302 provides a desired spread of illumination emitted by the LEDs based on an average ceiling height. Therefore, different angles may be more desirable, depending on ceiling height and/or other parameters.

The opposite side of the mount 302 is symmetrical in that immediately above face 320 is a face 324 that is also at angle α relative to horizontal. At the bottom of mount 302 there are two opposing flanges 326 and 328 which extend out horizontally and rest atop the inside housing of a fixture being retrofitted. The mount 302 may be fastened inside a housing of the fixture by self-tapping fasteners (not shown) that are screwed through holes 330 and 332 bored through the flanges 326 and 328, respectively.

The boards 304 and 306 each rest atop a platform portion 334 provided on each of fasteners 308. These platform portions 334 are on top of a body portion 336 of each fastener 308. The top portions 333 of each fastener can be forced through holes formed in the end of each sub-board (e.g., boards 354, 356, 358, and 360 of FIG. 3A). On the bottom of each fastener 308 is an insertable snap-lock tab 338, which may be inserted through a hole made through the angled faces 322 and 324. This secures each fastener 308 to the top of the mount 302 in an upright position as shown.

As described herein, the angle α of faces 322 and 324 of the mount 302 facilitates a desired illumination spread when the assembly is mounted into an existing fixture. In some embodiments, the assembly 300 may facilitate a real-time or current adjustment of the faces 322 and 324 with respect to one another. The mount 302 may include a pivot component 340 configured to enable an adjustment of angle α during a retrofit of a fixture. That is, in some embodiments, the mount 302 may be adjustable before, during, and/or after a retrofit into an existing fixture.

FIG. 3C shows an underside view of the mount 302. In this view an undersurface 344 exposes three devices—an emergency battery 348, an emergency power supply 350, and a main power supply 352. The devices (348, 350, and 352) can be fastened to the underside of the mount 302 using adhesives, fasteners, and/or other attachment components. Main power supply 352, such as a universal AC input, is used to tap into an existing power source in a building or other structure. Under normal operation, this device receives power from a power source in the building, and then supplies power to the LEDs 310—so long as there is power to the building. In cases when the primary power to the building is lost, and assuming that the building is the sort that has an emergency backup AC power source, emergency backup power supply 350 may be used to supply AC power to the LEDs, such as to a reduced number of the LEDs 310. In cases where all AC sources are not available, battery 348 and associated DC power supply 350 will be brought into action and used to illuminate a reduced number of operational LEDs on the mount 302.

Depending on the circumstances, there are numerous ways that the emergency lighting could be accomplished. In some embodiments, all of the LEDs 310 are active when the device is receiving power from the primary AC source (via power supply 352). Alternatively, a small number of the LEDs 310 will not be illuminated when the device is receiving the primary source of AC from the building. That is, only 310A and 310B could be configured to not illuminate when the primary source of AC power is available from the building. This smaller "emergency" group of LEDs would only illuminate when the primary source of AC is not available. For example, 80% of LEDs may be included in the primary group, and 20% may be included in the backup group. In this example, the 20% of the LEDs are not used in normal operation, and are only illuminated when there is a total power failure.

In some embodiments, all of the LEDs 310 could be used in normal operation. Then, upon a total AC power failure, emergency power supply 350 and possibly battery 348 could be used to activate the limited emergency group (some of the same LEDs used during normal operation) for the emergency purposes. For example, both of groups 310A and 310B (twelve LEDs total) may be the LEDs illuminated during the emergency.

Figures 4A, 4B:
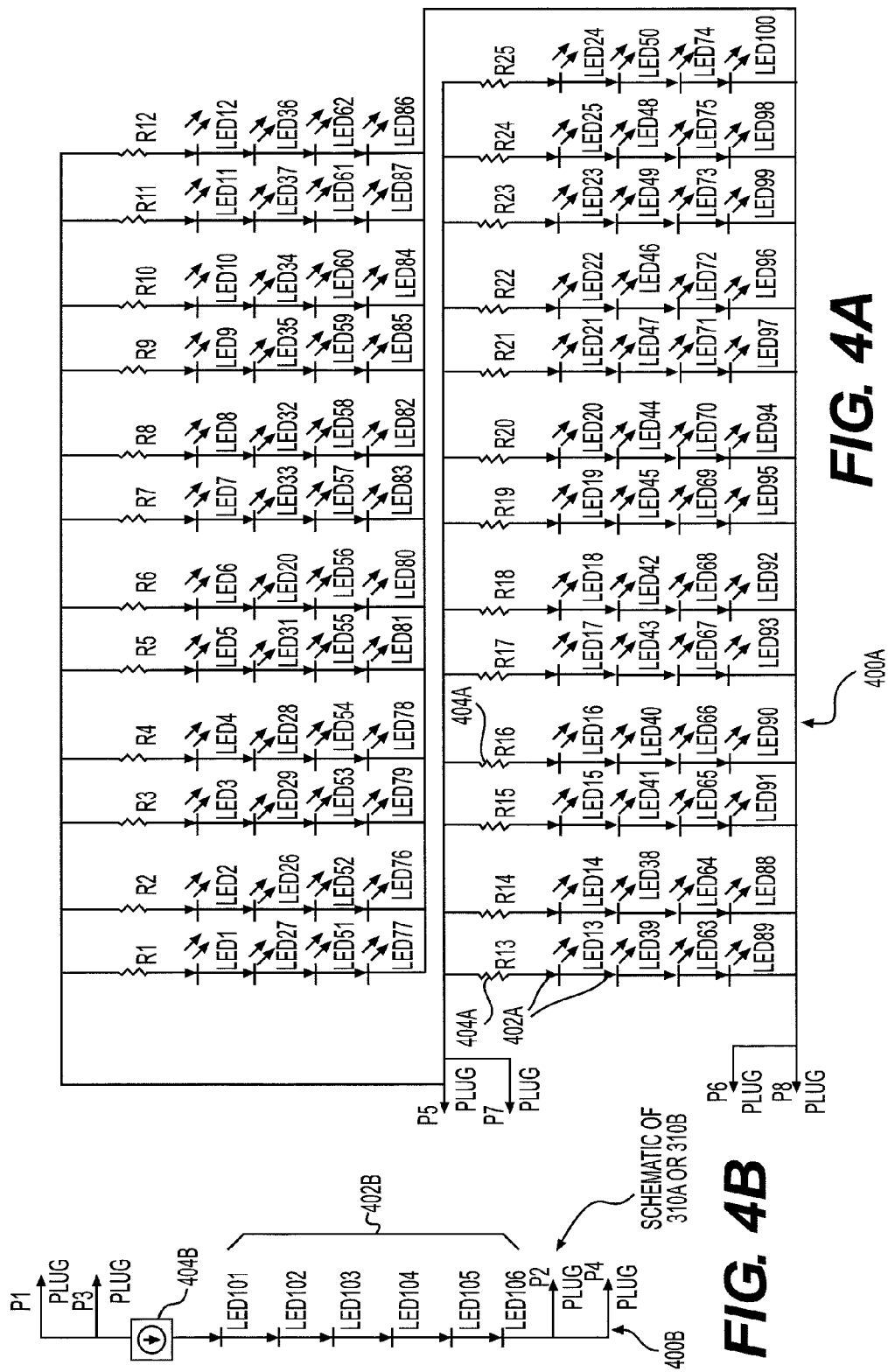
FIGS. 4A-C are three alternative schematic arrangements used to power the LED lamps.
Figure 4C:
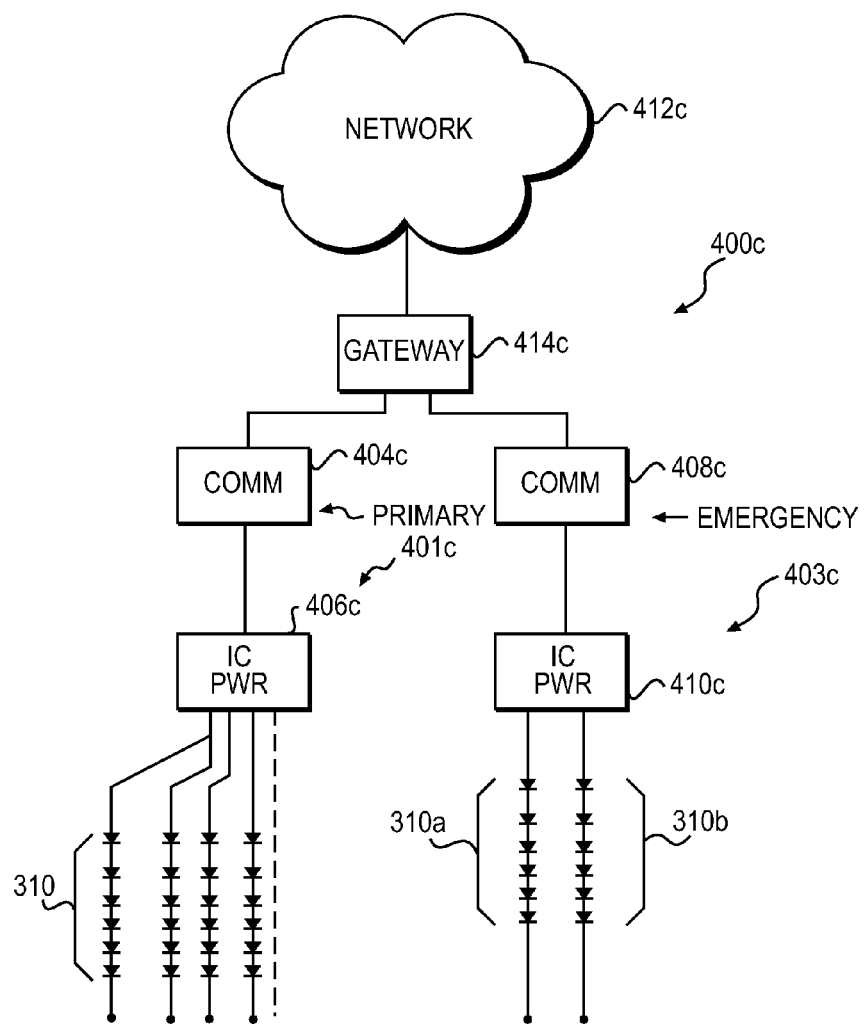

As described herein, a variety of circuitry arrangements may be utilized when illuminating LEDs on the boards 304 and 306 of the retrofit lighting assembly 300. FIGS. 4A-C show various embodiments for the circuitry used to deliver and control power to the LEDs. This circuitry would be included on the reverse side of the PCBs.

Referring to FIG. 4A, multiple LED strings are placed into parallel arrays, each string including four LEDs 402a and having a resistor 404A. The use of the resistor 404A provides a constant brightness arrangement in which the overall device will not be dimmable. Additionally, this arrangement may not support the selecting illumination of different groups of LEDs. Thus, although suitable for operation, FIG. 4A depicts a basic, cost-effective circuitry arrangement.

FIG. 4B depicts a six LED arrangement 402B, which is supported by a linear driver 404b. These devices allow for the delivery of the necessary current for driving LEDs 402b, and may be more efficient with respect to the arrangement shown in FIG. 4A.

FIG. 4C depicts a circuitry arrangement that facilitates the dimming of the lighting assembly. To do this, it includes a communications microprocessor 404c and a smart multi-channel linear LED driver 406c. The power administered through driver 406c is controlled using the communications microprocessor 404c, and may be fully networked.

This arrangement includes a primary side 401c, and an emergency side 403c. For the primary side 401c, the communications processor 404c is used to control a smart multichannel linear driver 406c to operate the primary group of LEDs 310. This primary group may include of all of the LEDs 310, or only the LEDs 310 not included in the smaller groups 310a and 310b. Regardless, the linear driver 406c receives a communicated signal from communications processor 404c to turn the primary set of LEDs on or off. These LEDs would be "on" when the primary source of AC power is available. The communications processor 404c may also communicate with a network gateway 414c, which may be patched into a network 412c (e.g., the internet or an intranet arrangement). Thus, the LEDs 310 are able to be turned on or off via a personal computer, wireless device or any other networkable device.

On the emergency side 403c of the system, lighting of a reduced number of LEDs will occur in the event that the primary source of AC power in the building is down, and the AC emergency backup system or the DC battery backup are utilized. When these secondary sources of power are utilized, communications processor 408c activates driver circuit 410c to drive the emergency group or groups of LEDs (e.g. 310a and 310b). Since communications processor 408c is accessible through gateway 414c, it is totally networkable. Thus, when desired, LED groups 310a and 310b can be independently activated (or not) over the network 412C.

In some embodiments, groups 310a and 310b are not also included in the primary circuit 401c. The two sides 401c and 403c are completely independent, and the LED groups 310a and 310b will only be activated in the event of an emergency. In an alternative embodiment, groups 310a and 310b are also included on the primary side 401C of the circuit, and may be illuminated not only in backup situations, but also when AC primary power is available.

In some embodiments, the circuitry arrangement may be configured to provide independent control of the left and right strings of LEDs or combination of LED strings, allowing one to be turned off while one remains illuminated, or to have both LED strings "ON" or "OFF". Incorporating a dimmer-switch board, the circuitry arrangement facilitates such a bi-level dimming capability of each elongated LED board and provides a light output at the levels of 0%, 50%, and/or 100%. When power is cycled to the elongated LED board, within a short amount of time this change may be detected by a power loss detection circuit on the dimmer-switch board, which sees this change as a signal to alternate the dimming state of the elongated LED board from both LED strings "ON" or both strings "OFF" to one string "ON" and one string "OFF" (delivering 50% light output). When power is turned off for longer than a predetermined length of time, the dimmer-switch board will reset its dimming state such that 100% of the LED strings will be on the next time the elongated LED board is powered on. Because the individual elongated LED boards can be controlled on a per strip basis, the number of dimming steps can be expanded per application.

In some embodiments, the circuitry arrangement may be configured to facilitate switching the reception of power from the electric grid to a battery backup during peak electrical usage hours, thereby removing the electrical load that the elongated LED board would typically put onto the electric grid. The system will be able to switch back to being powered from the electrical grid after peak usage hours. The battery backup will automatically charge during predetermined low usage hours and will also run on a staggered or random charging schedule during these low usage hours to avoid all of the lighting systems trying to charge simultaneously, which may place an undesirable heavy load onto the electric grid. The battery backed up elongated LED boards may also switch back onto the electrical grid on a staggered or random schedule to further avoid putting an undesirable heavy load onto the electric grid. The nighttime energy harvesting system may be able to automatically compensate for daylight savings and other time change occurrences via an onboard RTC (real time clock) chip that will keep track of the time and date, or by a manual adjustment via an external control mechanism, among other things. The nighttime energy harvesting system will also have an emergency power save feature that will switch the elongated LED board back onto the electrical grid regardless of the time of day if the battery backup reaches a certain percentage below "fully charged". This feature thereby ensures that, in case of emergency, the elongated LED board will still have a reserve of power to energize itself for a period of time.

As described herein, the elongated boards 304 and 306 may be formed of multiple PC boards. FIGS. 5A-G depict various configurations in which smaller PC boards (e.g., boards 354, 356, 358, and 360) may be connected together to comprise two elongated boards 304 and 306.

In some embodiments, in order to connect two smaller boards to one another, a connector board 502 is used to both physically join the two abutting ends, such as ends 504 and 506 of boards 354 and 356, respectively. On each of ends 504 and 506, pin receiving holes 508 and 512 are shown associated with traces 510 and 514. Traces 510 and 514 extend to the end of the boards 504 and 506. Alternatively, traces 510 and 514 may not be required, depending on the extent of the traces (e.g., traces 516) on the connector board 502. For example, when traces 516 on the connector board 502 are long enough to reach the pin receiving holes 508 and 512 on boards 354 and 356, the traces 510 and 514 will not be required.

Figure 5A:
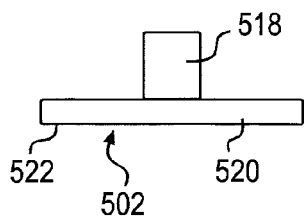
FIG. 5A shows a side view of a connector block used to electrically and physically connect two PCBs together at a joint.

In FIG. 5A, the connector board 502 includes a base portion 522 and a female receptacle 518. Female receptacle 518 is a well-known device, which includes pins and receives a plug connector, such as plug connector 530 shown in FIG. 5E.

Figure 5B:
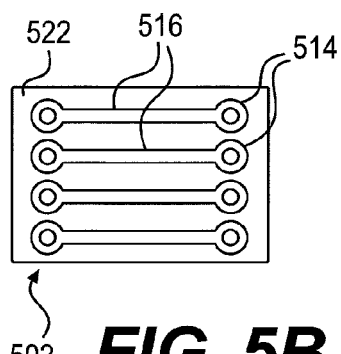
FIG. 5B shows a back side view of the connector block shown in FIG. 5A.

FIG. 5B depicts an engagement side 522 of bottom portion 520 of the connector board 502. On the engagement side 522, each of pin receiving holes 508 and 512 are interconnected by a plurality of parallel traces 516. These traces 516 will be used to electrically and signally connect the blurred ends to each other, as shown in more detail in FIG. 5E.

Figure 5C:
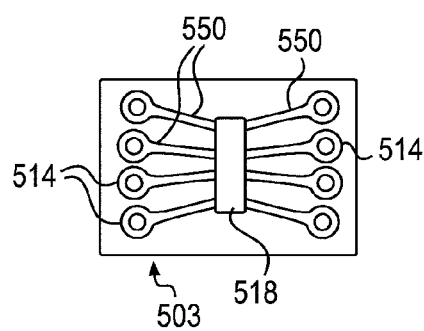
FIG. 5C shows a top view of an alternative connector block wherein the traces are included on the top of the block.
Figure 5D:
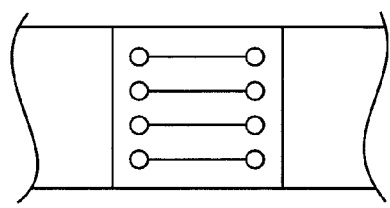
FIG. 5D shows a view of a connector block from above in place between two PCBs.
Figure 5E:
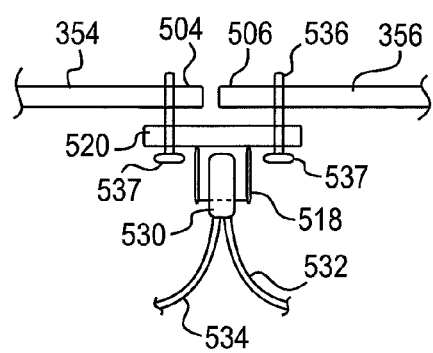
FIG. 5E shows a side view of a connector block installed between two PCBs.

FIG. 5E depicts an interconnect board 520 that has been used to punch together two board ends 504 and 506 using pins 536. Pins 536 are used to conduct electrical power, transmit communications signals, and physically secure the boards 354 and 356 to each other such that the connection of all the smaller boards comprises the two elongated boards 304 and 306. As depicted, the female receptacle 518 extends downward after the interconnector board 520 has been pinned to each PCB end. Thus, a plug connector 530 can be inserted and secured in the receptacle 518 to make the necessary electrical connections.

Figure 5F:
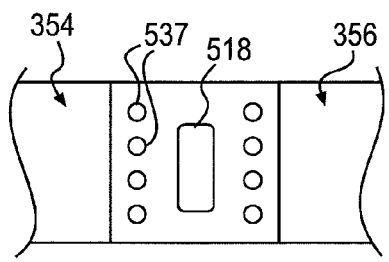
FIG. 5F shows a view of the connector block installed between two PCBs from below.
Figure 5G:
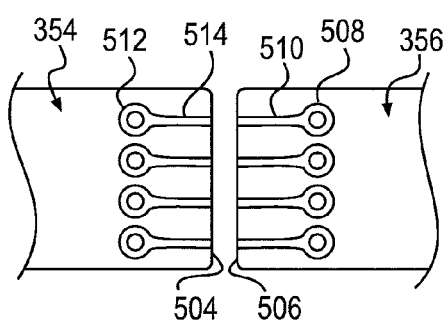
FIG. 5G shows the ends of two PCBs as they appear before the connector block is installed.

FIG. 5F depicts the interconnecting member 502 installed on the underside of board ends 354 and 356, showing the female receptacle 518 and the connecting pin heads 537. In FIG. 5F, the plug 530 has not yet been inserted.

FIG. 5C depicts an alternative tracing arrangement for the connector 502. In FIG. 5C, the traces 550 are on the same side of the connector board as the female receptacle 518. These traces are angled outward to meet up with the pin heads 537 upon installation.

Thus, in some embodiments, the small PC boards are connected with a variety of mechanisms to fix the boards to one another, to transfer electric current to one another, to communicate with one another, and so on. For example, utilizing the connections described in FIGS. 5A-5F, two connected PC boards may rotate with respect to one another, among other things.

Figure 6:
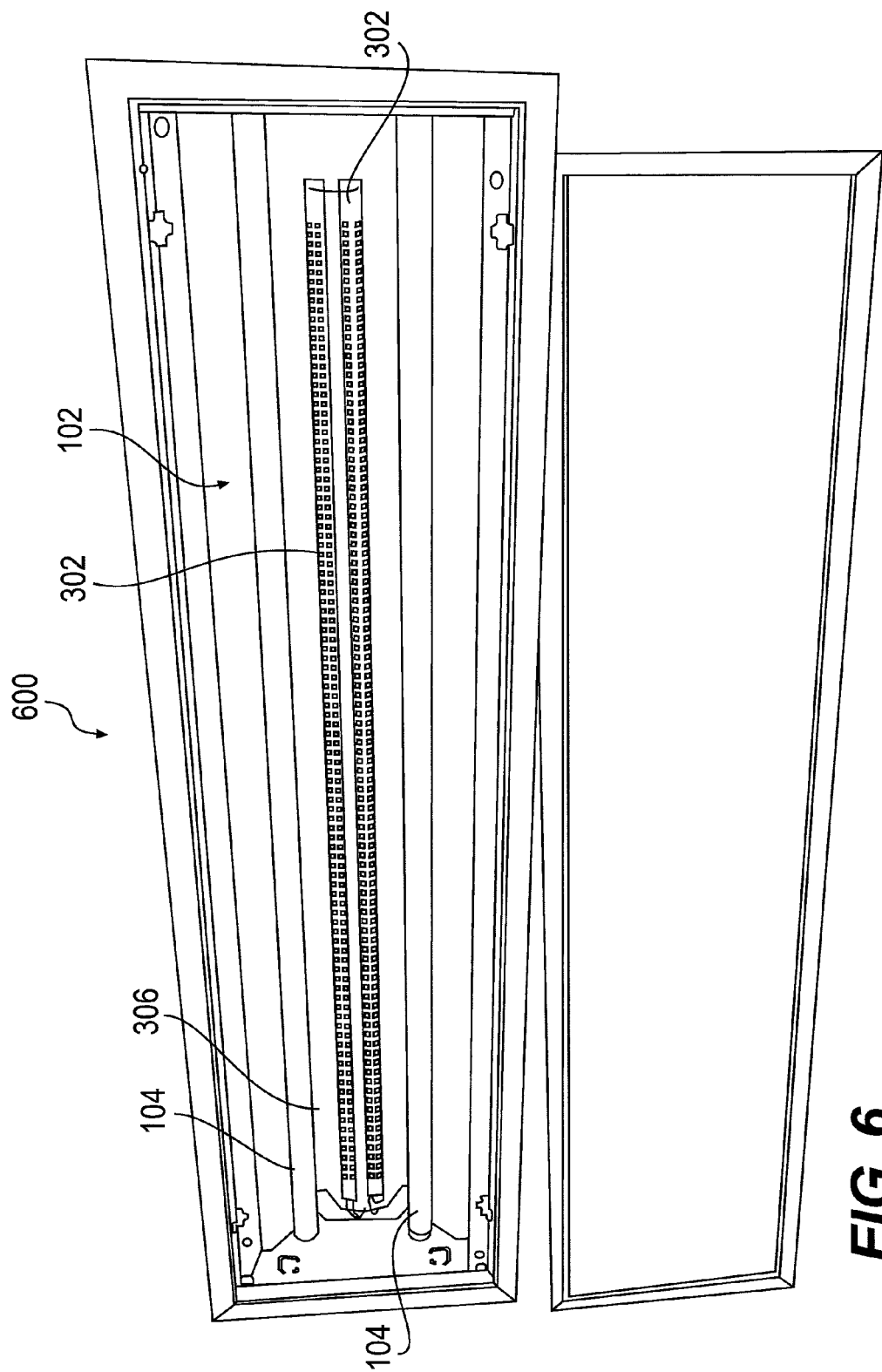
FIG. 6 is a perspective view of the fluorescent lamp housing shown in FIG. 1 after it has been subjected to the processes and systems of the disclosed embodiments.

As described herein, the mount 302 and attached PC boards 304 and 306 are configured to be installed into existing lighting fixtures, such as fluorescent tube lighting fixtures, in order to retrofit the lighting fixtures with an LED-based illumination system that provides desirable illumination patterns, among other benefits. FIG. 6 shows an installation of the retrofit device on mount 302 in an existing fluorescent housing.

Figure 7:
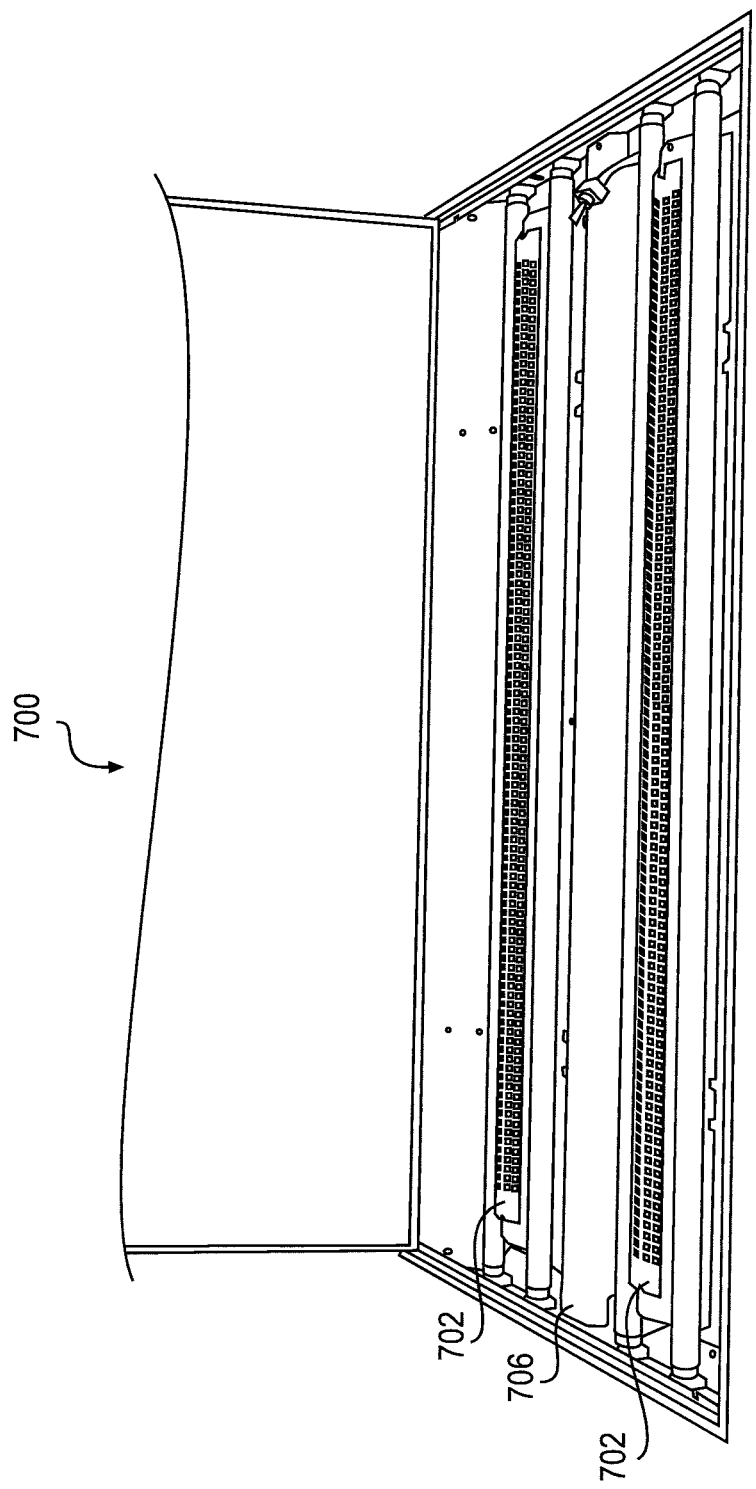
FIG. 7 is a perspective view of the fluorescent lamp housing shown in FIG. 2 after it has been subjected to the processes and systems of the disclosed embodiments.

FIG. 7 shows a dual-installation where two retrofit devices are used to convert a four-bulb fluorescent light arrangement.

In some embodiments, in order to retrofit the lighting assembly 300 into an existing housing, such as fluorescent lamp housings 100 and 200, the following steps may be performed.

After shutting off power to the unit, the existing ballast equipment and the cover (e.g., cover 106) are removed, along with any remaining bulbs. However, in some cases ballast removal may not be necessary because of where the mount 302 is to be secured.

With respect to the assembly of FIG. 6, after the ballast and cover have been stripped from the unit, a single retrofit lighting assembly 300 is fastened into the space formerly occupied by the ballast equipment, and fasteners (e.g., screws, not shown) can be secured into the back of the housing through attachment holes 330.

With respect to the assembly of FIG. 7, since the ballast arrangement and cover 206 are located in the center of the housing and do not have to be removed, two separate duplicate versions 702 of the lighting assembly 300 can be fixed into the back of the housing as shown.

Once the lighting assemblies 300 have been installed, electrical connections are made. For example, connections are made from the building primary AC source and building emergency power supplies into power sources 352 and 350, respectively, and from each of the power sources 350, 352, and battery 348 into the PCB circuitry. Also, battery 348 may be electrically connected to the primary AC source so that it can remain charged. Once installed and electrically connected, the new retrofit devices (600 or 700) are ready for operation.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A lighting assembly for installation in an existing light fixture, the lighting assembly comprising:
    an elongated mounting component with two elongated mounting surfaces;
    two or more elongated printed circuit boards including a plurality of LEDs on a first surface and circuitry on a second surface, the printed circuit boards fastened to the mounting surfaces using longitudinally-spaced nonconductive fasteners, substantially parallel to but elevated above the mounting surfaces thus creating a vertical gap between the mounting surfaces of the mounting component and the relatively parallel printed circuit boards;
    wherein the lighting assembly is configured to be mountable to extend within the existing light fixture such that the LEDs are positioned to direct light outwardly and downwardly from a longitudinal axis of the existing lighting fixture to form light output which is a substitute for a lighting pattern previously exhibited by the existing light fixture.

2. The lighting assembly of claim 1, wherein each of the two or more elongated printed circuit include at least two smaller printed circuit boards and a connector device physically and electrically connecting adjoining ends of each of the smaller printed circuit boards.

3. The lighting assembly of claim 1, wherein when the lighting assembly is mounted to the existing light fixture, the mounting surfaces are positioned at outward angles having ranges of 10 degrees to 20 degrees from a horizontal plane defined by the existing lighting fixture.

4. The lighting assembly of claim 1, wherein, when the lighting assembly is mounted to the existing light fixture, the mounting surfaces are positioned at outward angles having ranges of 12.5 degrees to 17.5 degrees from a horizontal plane defined by the existing lighting fixture.

5. The lighting assembly of claim 1, wherein, when the lighting assembly is mounted to the existing light fixture, the mounting surfaces are positioned at outward angles having ranges from about 13.5 degrees to 16.5 degrees from a horizontal plane defined by the existing lighting fixture.

6. The lighting assembly of claim 1, wherein, when the lighting assembly is mounted to the existing light fixture, the mounting surfaces are positioned at outward angles approximately 15 degrees from a horizontal plane defined by the existing lighting fixture.

7. The lighting assembly of claim 1, the elongated mounting component includes a power support portion with at least one component that provide power to the lighting assembly, wherein the at least one component is positioned between the mounting component and the existing lighting fixture when the lighting assembly is mounted to the existing light fixture.

8. The lighting assembly of claim 1, wherein a circuitry arrangement on the two or more printed circuit boards includes components configured to illuminate the LEDs contained by the two or more printed circuit boards in a dimming pattern.

9. The lighting assembly of claim 1, wherein a circuitry arrangement of the two or more printed circuit boards includes components configured to illuminate the LEDs contained by the two or more printed circuit boards in a bi-level dimming pattern.

10. The lighting assembly of claim 1, wherein a circuitry arrangement of the two or more printed circuit boards includes components configured to switch between a grid-based power source and an alternative battery-based power source located in the lighting assembly based on receipt of a signal transmitted by a local communications device.

11. A light assembly comprising:

an elongated mounting component with two elongated mounting surfaces;

two or more elongated printed circuit boards including a plurality of LEDs on a first surface and circuitry on a second surface, the printed circuit boards fastened to the mounting surfaces using longitudinally-spaced nonconductive fasteners, substantially parallel to but elevated above the mounting surfaces thus creating a vertical gap between the mounting surfaces of the mounting component and the relatively parallel printed circuit boards;

wherein the lighting assembly is configured to be mountable to extend within the existing light fixture such that the plurality of LEDs are positioned to direct light outwardly and downwardly from a longitudinal axis of the existing lighting fixture to form light output which is a substitute for a lighting pattern previously exhibited by the existing light fixture a main AC power supply;

a DC power supply included along with a chargeable battery;

a networked processing component included in the assembly, the networked processing component adapted to transmit a signal based on a received condition, the signal causing the plurality of LEDs to be powered by the DC power supply thus draining the battery.

* * * * *